(12) United States Patent
Inoue

(10) Patent No.: US 7,106,767 B2
(45) Date of Patent: Sep. 12, 2006

(54) SEMICONDUCTOR LASER DEVICE

(75) Inventor: Tetsuyoshi Inoue, Yamatotakada (JP)

(73) Assignee: Sharp Kabushiki Kaisha, Osaka (JP)

( * ) Notice: Subject to any disclaimer, the term of this patent is extended or adjusted under 35 U.S.C. 154(b) by 250 days.

(21) Appl. No.: 10/679,497

(22) Filed: Oct. 7, 2003

(65) Prior Publication Data
US 2004/0228378 A1 Nov. 18, 2004

(30) Foreign Application Priority Data
Oct. 22, 2002 (JP) ............................. 2002-307002

(51) Int. Cl.
*H01S 3/04* (2006.01)
(52) U.S. Cl. .......................................... 372/36; 372/34
(58) Field of Classification Search ............ 372/46.01, 372/36, 29.022
See application file for complete search history.

(56) References Cited

U.S. PATENT DOCUMENTS 5,727,009 A * 3/1998 Tajiri et al. .............. 372/50.11

FOREIGN PATENT DOCUMENTS

| CN | 1315976 A | 10/2001 |
|---|---|---|
| JP | 08-96393 | 4/1996 |
| JP | 11-25465 | 1/1999 |
| JP | 2000-228467 | 8/2000 |
| JP | 2001-111159 | 4/2001 |
| JP | 2001-148137 | 5/2001 |

OTHER PUBLICATIONS

Chinese Office Action dated Jan. 7, 2005.
Japanese Office Action mailed Apr. 18, 2006, directed to counterpart JP Application No. 2002-307002.
Chinese Office Action dated Jul. 29, 2005, directed to corresponding foreign application.

* cited by examiner

*Primary Examiner*—Minsun Oh Harvey
*Assistant Examiner*—Tuan N. Nguyen
(74) *Attorney, Agent, or Firm*—Morrison & Foerster LLP

(57) ABSTRACT

The present invention provides a semiconductor laser device of which reliability is enhanced. In the semiconductor laser device of the present invention, a semiconductor laser element 3 emitting laser light in a plane direction, a reflection mirror 4 reflecting the laser light in an upper direction and a light acceptance unit 5 detecting signal of incident laser light are disposed inside an insulative frame 2. A plurality of leads 8 extending in a horizontal direction are fixed in the end walls 2a, 2b opposed to each other in the longitudinal direction of the insulative frame 2. The insulative frame 2 is made of liquid crystal polymer.

4 Claims, 10 Drawing Sheets

SEMICONDUCTOR LASER DEVICE

BACKGROUND OF THE INVENTION

The present invention relates to a semiconductor laser device. Particularly, the present invention relates to a semiconductor laser device used as an optical pickup apparatus which reads out information recorded in an optical recording medium or writes information in the optical recording medium.

As a conventional semiconductor laser device, Japanese Laid-open patent publication No. 2001-111159 describes a semiconductor laser device 104 as shown in FIG. 9. In a housing portion of an insulative frame 100 with an upper end opened, a semiconductor laser element 101, a reflection mirror 102, a light acceptance unit 103 and so on are housed. The insulative frame 100 is made of PPS resin having a heat-resisting temperature of 260° C. However, in a fabrication process, high heat resistance is required when heating wire bond or soldering the semiconductor laser device by lead free solder. The conventional PPS resin has a disadvantage that a margin of the heat resistance is not enough.

Also, in the conventional semiconductor laser unit 104, when providing leads 105 on the insulative frame 100, the end 105a of each lead 105 is pressed on the bottom of the housing portion from upward to fix the lead 105. However, there has been a disadvantage that skew or shift of the lead 105 is caused when fixing the lead 105, resulting in decrease of reliability of the wire bond and deterioration of dimensional and positioning accuracy as a product of semiconductor laser device.

There has been an another disadvantage that as the insulative fame 100 of the conventional semiconductor laser device 104 has thin thickness as compared to the longitudinal dimension of the frame 100, the frame 100 deforms when the temperature is elevated. Also, there has been a disadvantage that the mechanical strength is low even at a normal temperature.

In the conventional semiconductor laser device 104, light emitted from the semiconductor laser element 101 in a plane direction is reflected on the reflection mirror 102 and irradiated in a top surface direction. As shown in FIG. 10, when attaching the reflection mirror 102 on an inclined surface of a stem 106 formed around the semiconductor laser element 101, resin is applied on a reflection-mirror attaching position (inclined surface) and the reflection mirror 102 is disposed and fixed thereon. In this method, however, the movement of the reflection mirror 102 is not restrained when fixing the reflection mirror 102. Therefore, there has been a disadvantage that the reflection mirror 102 is shifted, generating lift or skew and causing deterioration of fabrication accuracy or product properties.

Furthermore, in the conventional semiconductor laser device 104, signal processing (signal detecting) of light reflected on and returned from an optical recording medium is conducted using only one light acceptance unit 103. However, as shown in FIG. 10, when fixing the reflection mirror 102, for example, if the reflection mirror 102 is inclined in a direction shown by an arrow A, a light input position on the light acceptance unit 103 for signal detecting is shifted as show in FIG. 11 in a left-right direction in the figure from a light input position P at the time of focalizing. On the other hand, if the reflection mirror 102 is inclined in a direction shown by an arrow B, the light input position is shifted as shown in FIG. 11 in an up-down direction in the figure. The shift of the light input position P is also caused by change of ambient temperature.

SUMMARY OF THE INVENTION

Thus, it is an object of the present invention to provide a semiconductor laser device of which reliability is enhanced.

In order to attain the above object, the present invention provide a semiconductor laser device, comprising:
an insulative frame;
a semiconductor laser element disposed inside the insulative frame, the semiconductor laser element emitting laser light in a plane direction;
a reflection mirror disposed inside the insulative frame, the reflection mirror reflecting the laser light in an upper direction;
a light acceptance unit for signal detecting disposed inside the insulative frame, the light acceptance unit detecting signal of incident laser light; and
a plurality of leads fixed in the end walls opposed to each other in the longitudinal direction of the insulative frame, the plurality of leads extending in a horizontal direction;
wherein the insulative frame is made of liquid crystal polymer.

According to the present invention, crystal liquid polymer is used as material of the insulative frame of the semiconductor laser device. Since the crystal liquid polymer has more excellent heat resistance and workability than conventionally used PPS (polyphenylene sulfide) resin, heat resistance becomes higher, enhancing reliability when wire bonding and soldering and also increasing process yield Preferably, one end of each of the leads protrude inside the end walls and wherein openings are formed above and beneath the end of each of the leads on the upper and lower surfaces of the insulative frame. Thus, at the molding, the end of each lead can be secured by jigs inserted through the upper and lower openings of the insulative frame from upper and lower directions, preventing the leads from being accidentally moved and being skewed and shifted.

Preferably, thick portions are formed on both side walls extending in a longitudinal direction of the insulative frame. The thick portions is formed such that the fabrication process is not interrupted when disposing the parts (the semiconductor laser element, the reflection mirror, the light acceptance unit for signal detecting and so on) inside the insulative frame. Thus, cause of deformation of the insulative frame due to elevation of the ambient temperature is eliminated, whereby the strength of the insulative frame, preferably the longitudinal strength is enhanced even at the normal temperature.

Preferably, the reflection mirror is mounted using UV resin. The UV resin has low resin viscosity and can be cured only by irradiating ultraviolet light, whereby the handling is easy and disadvantages of the reflection mirror such as skew and lift can be eliminated.

Preferably, the light acceptance unit for signal detecting comprises two light acceptance units, enabling to compensate quantity of shift which is caused by temperature properties of the light acceptance unit for detecting signal or skew of the reflection mirror when focusing.

BRIEF DESCRIPTION OF THE DRAWINGS

Further objects and advantages of the present invention will become clear from the following description taken in conjunction with the preferred embodiments thereof with reference to the accompanying drawings, in which.

DETAILED DESCRIPTION OF THE PREFERRED EMBODIMENTS

Figure 1:
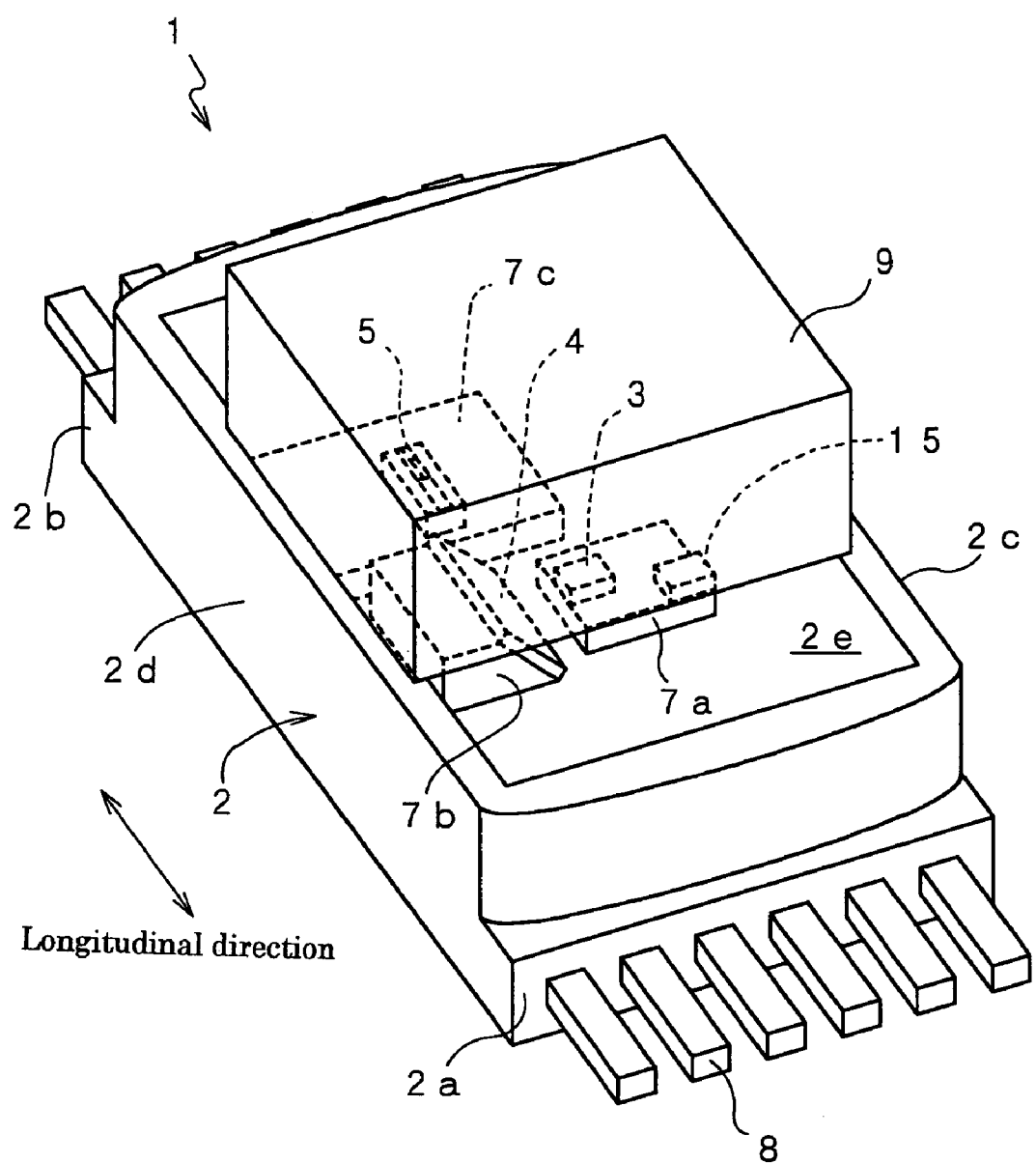
FIG. 1 is a perspective view of a semiconductor laser device according to the present invention.
Figure 2:
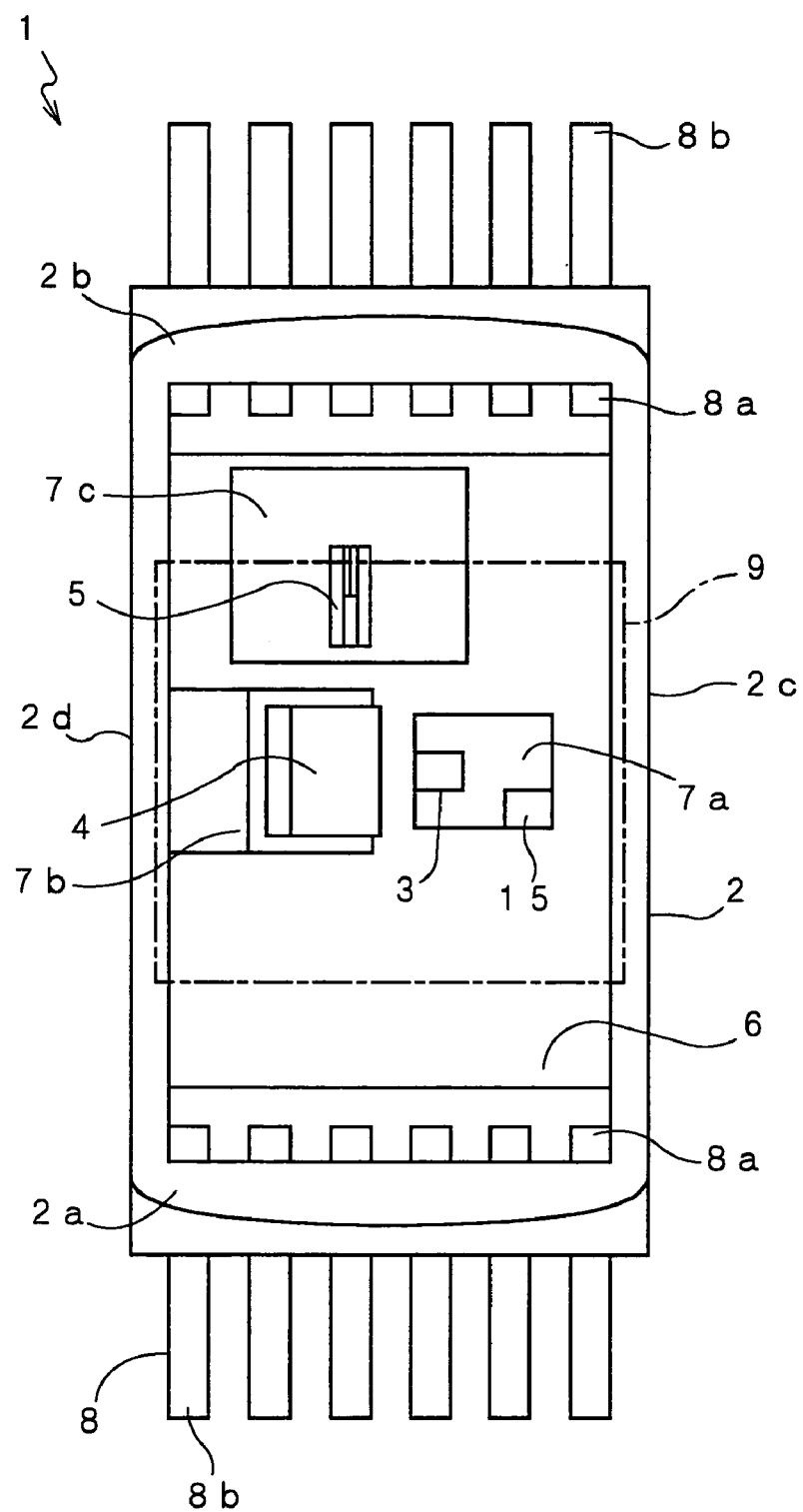
FIG. 2 is a top view of the semiconductor laser device according to the present invention.
Figure 3:
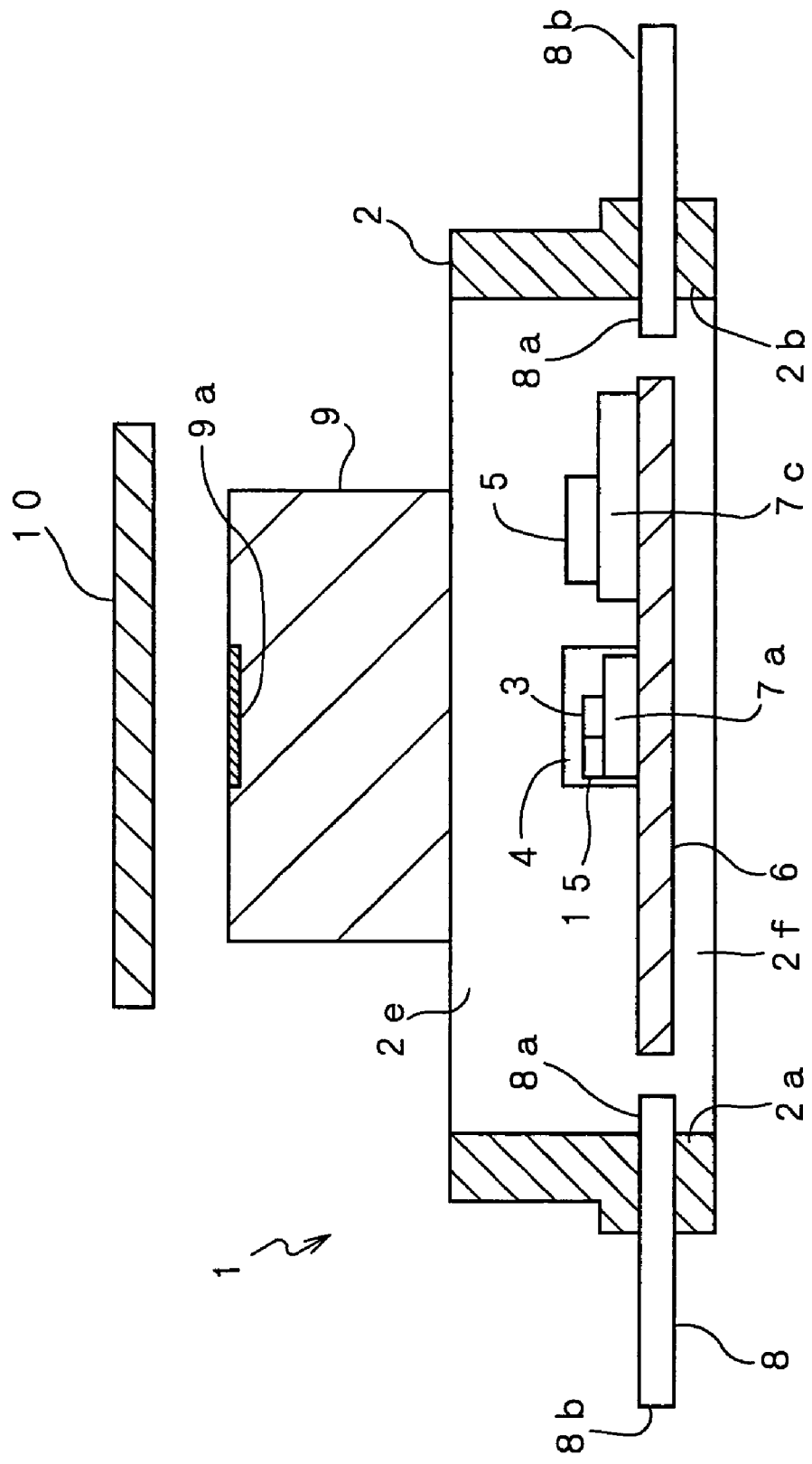
FIG. 3 is a sectional view of the semiconductor laser device according to the present invention.

FIGS. 1–3 show a semiconductor laser device 1 according to the present invention. The semiconductor laser device 1 has a known construction that a semiconductor laser element 3, a reflection mirror 4 and a light acceptance unit 5 for signal detecting are provided inside of an insulative frame (package) 2.

The insulative frame 2 has a rectangular box-like shape and is provided with end walls 2a, 2b opposite to each other in a longitudinal direction and side walls 2c, 2d extending in a longitudinal direction. The insulative frame 2 is made of liquid crystal polymer (GENESTA® G2450 from Kuraray Co., Ltd.). The liquid crystal polymer has a heat-resisting temperature of 290° C. and has excellent heat resistance and workability in comparison with the conventional PPS resin. On the upper surface and lower surface of the insulative frame 2 are formed an upper opening 2e and a lower opening 2f which are connected through the insulative frame 2 toward the lower surface from the upper surface. Inside the insulative frame 2, a stem table 6 is disposed integrally with the insulative frame 2. On the stem table 6, the semiconductor laser element 3, the reflection mirror 4 and the light acceptance unit 5 for signal detecting are mounted via stems 7a, 7b, 7c, respectively. On the upper surface of the stem 7a, a photodiode 15 for monitoring is mounted.

Both sides of the stem table 6, a plurality of leads 8 extending in a horizontal direction are disposed. The leads 8 are connected to the optical elements (that is, the semiconductor laser element 3, the light acceptance unit 5 for signal detecting and the photodiode 15 for monitoring) via wires not shown so that the optical elements can be electrically connected to an external electrical circuit and so on. The leads 8 are fixed in the end walls 2a, 2b positioned in the longitudinal direction of the insulative frame 2. As shown in FIGS. 2, 3, one end 8a of each lead 8 is protruded toward the inside of the end walls 2a, 2b of the insulative frame 2, while other end 8b of each lead 8 is protruded toward the outside of the end walls 2a, 2b of the insulative frame 2.

On the upper opening 2e of the insulative frame 2, a hologram element 9 is mounted and fixed by means of adhesive resin. On the top surface of the hologram element 9 is formed a hologram 9a.

In the semiconductor laser device 1 having above construction, laser light is emitted from the semiconductor laser element 3 toward the reflection mirror 4. The laser light is upwardly reflected on the reflection mirror 4, passes through the inside of the hologram element 9 and is irradiated outside from the hologram 9a. The irradiated laser light is reflected on an outside optical disc 10 (shown in FIG. 3) and so on and comes into the hologram 9a again so that light diffracted by the hologram 9a comes into the light acceptance unit 5 for signal detecting. Thus, recorded information recorded on the optical disc 10 and so on can be read out.

Figure 4:
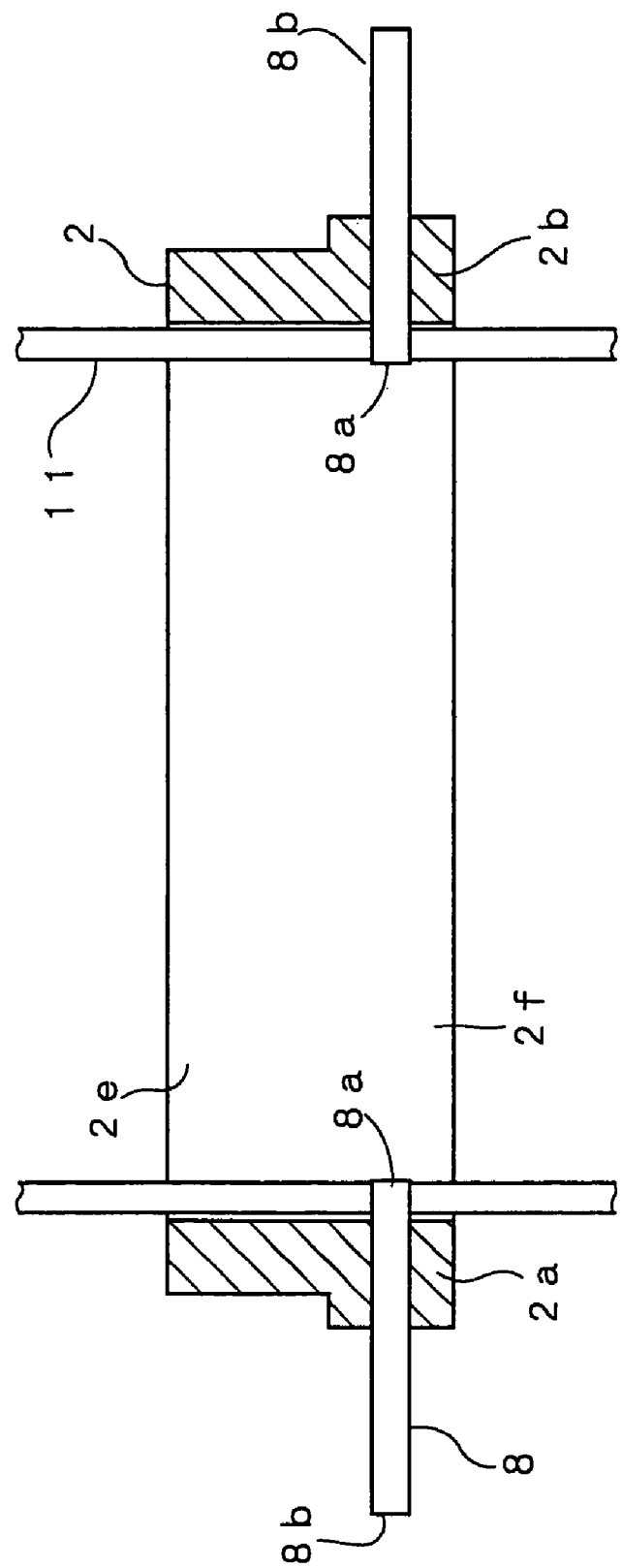
FIG. 4 is a sectional view showing when fabricating the semiconductor laser device of FIG. 1.

Next, a method for molding the leads 8 integrally with the insulative frame 2 will be explained. At the molding, as shown in FIG. 4, the end 8a of each lead 8 is secured by jigs 11 inserted through the upper and lower openings 2e, 2f of the insulative frame 2 from upper and lower directions, preventing skew and shift of the leads 8.

Figure 5:
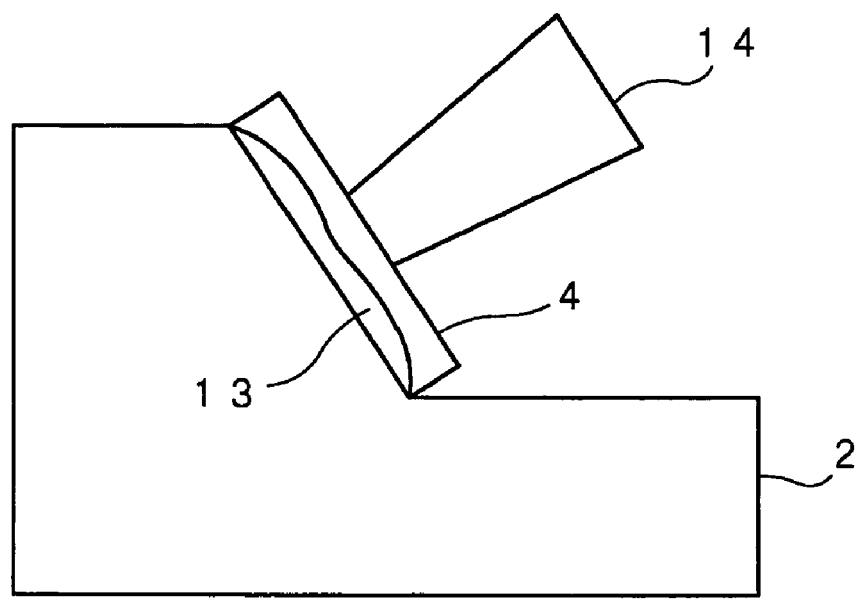
FIG. 5 is a partly enlarged view showing when fabricating the semiconductor laser device of FIG. 1.

Further, a method for fixing the reflection mirror 4 on the insulative frame 2 will be explained. First, as shown in FIG. 5, UV resin (ultra-violet curing type resin) 13 is applied on a mounting position of the reflection mirror 4 on the insulative frame 2, i.e., on an inclined surface of the stem 7b. Then, the reflection mirror 4 is pressed toward the stem 7b using a collet 14. In this state, UV light is exposed so that the UV resin 13 is cured to fix the reflection mirror 4. As a result, disadvantages of the reflection mirror 4 such as skew and lift can be eliminated. The reason for using the UV resin 13 is that the handling is easy because of low viscosity of the resin and that curing method is easy.

Figure 6:
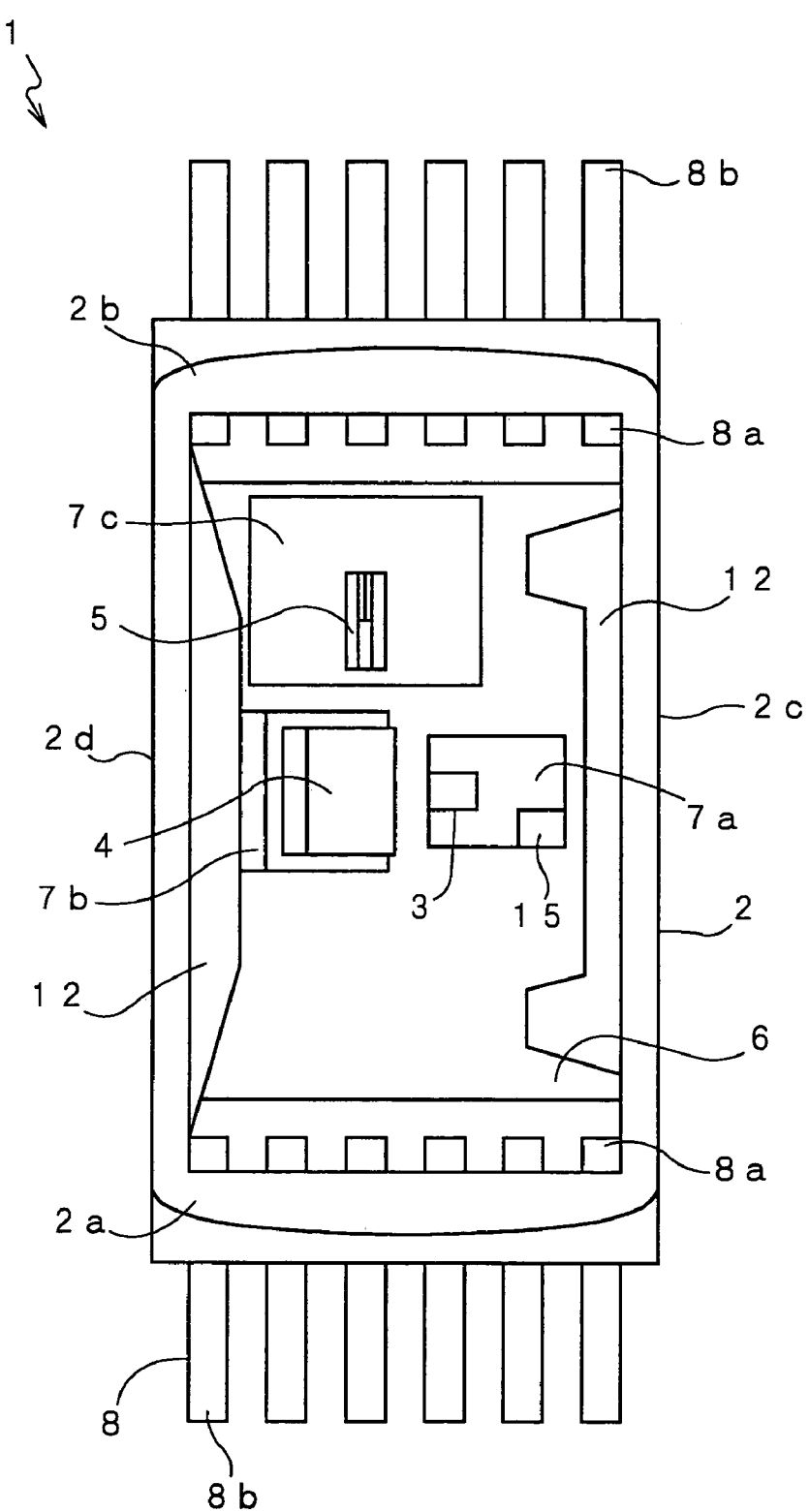
FIG. 6 is a top view of a variation of the semiconductor laser device of FIG. 1.

As a variation of above embodiment, as shown in FIG. 6, thick portions 12 may be integrally formed on the both side walls 2c, 2d of the insulative frame 2. The shape of the thick portions 12 is such that the fabrication process is not interrupted when disposing the parts (the semiconductor laser element 3, the reflection mirror 4, the light acceptance unit 5 for signal detecting and so on) inside the insulative frame 2. Thus, the insulative frame 2 does not deform as the ambient temperature is elevated and the strength of the insulative frame 2, preferably the longitudinal strength is enhanced.

Figure 7:
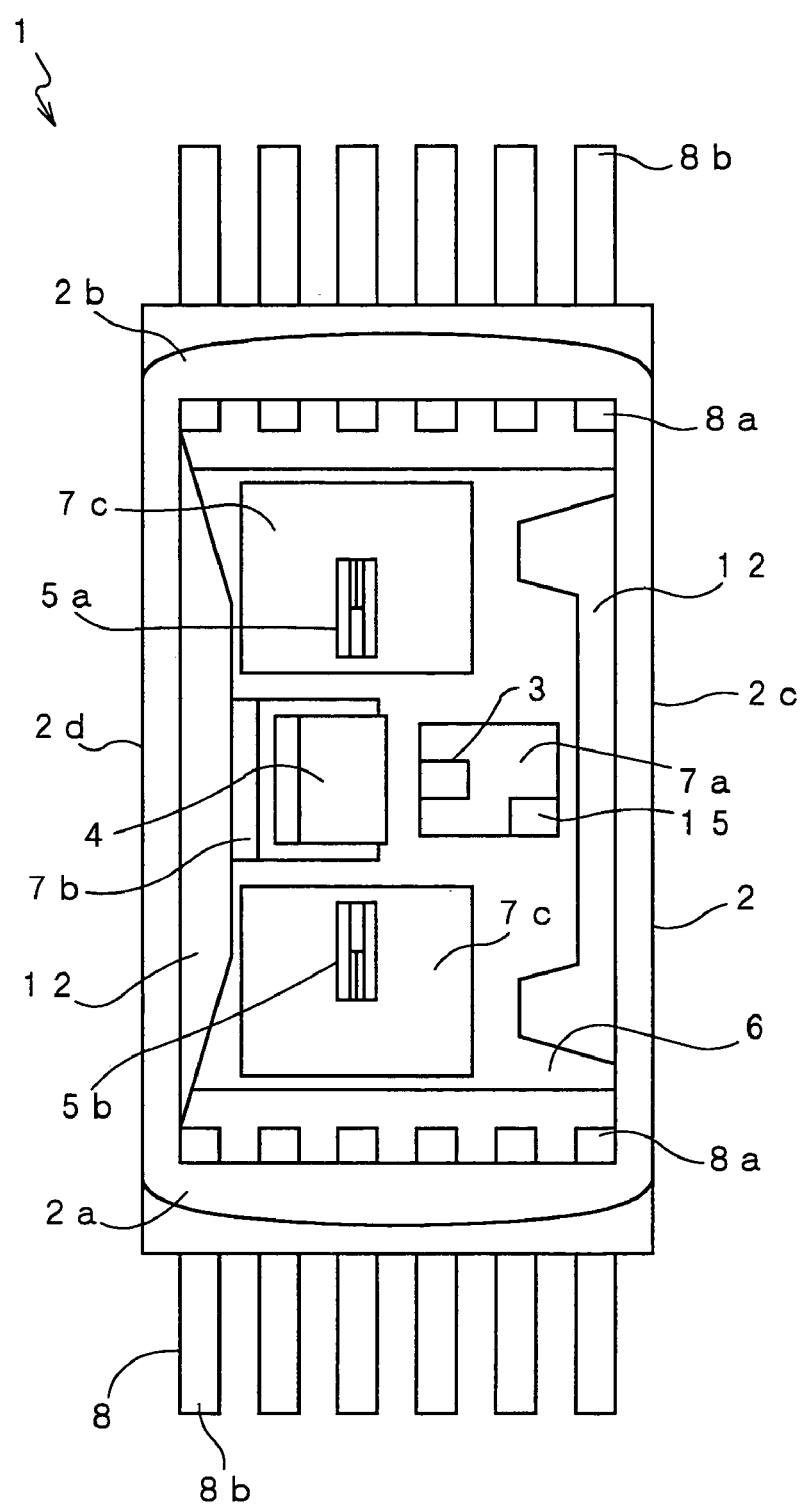
FIG. 7 is a top view of a variation of the semiconductor laser device of FIG. 1.
Figure 8:
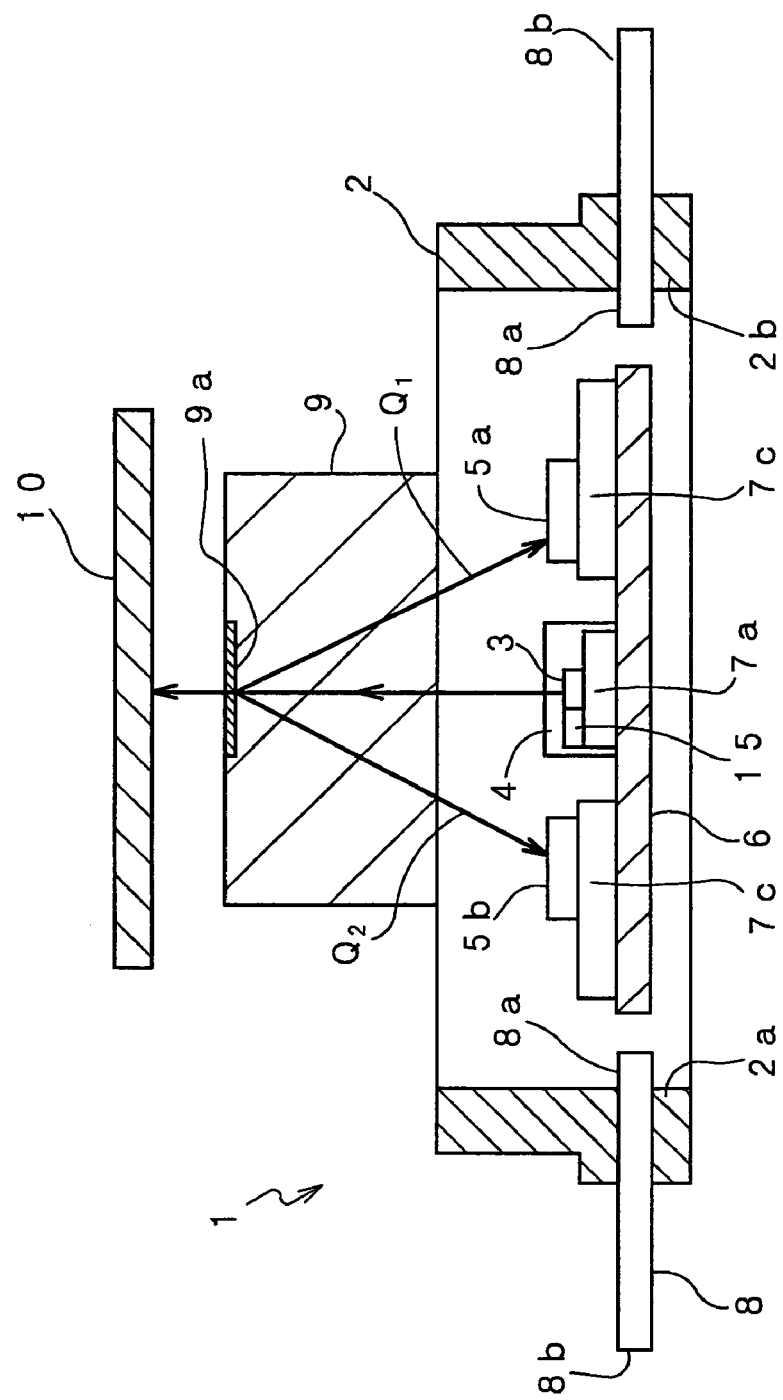
FIG. 8 is a sectional view of the semiconductor laser device of FIG. 7.
Figure 9:
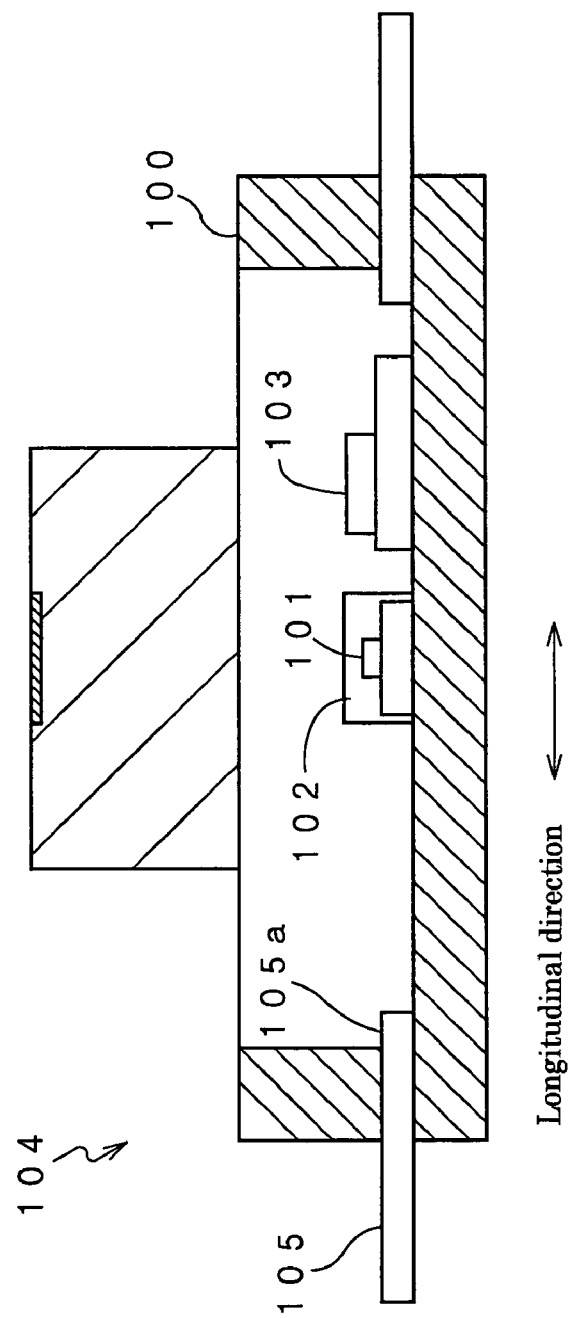
FIG. 9 is a sectional view of a conventional semiconductor laser device.
Figure 10:
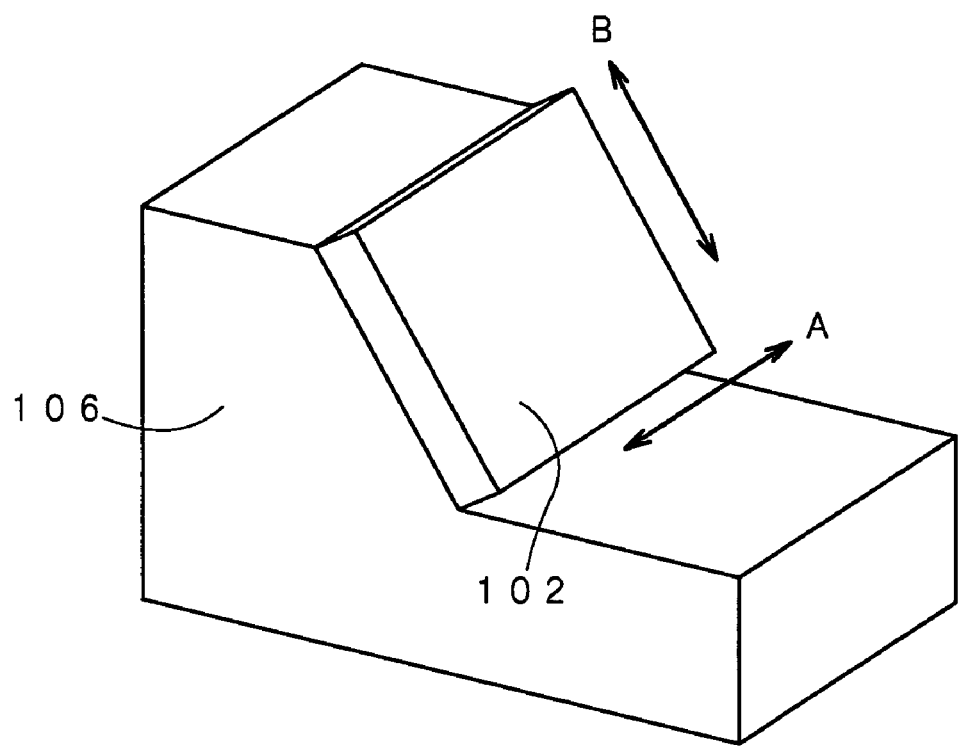
FIG. 10 is a perspective view showing a reflection mirror of the conventional semiconductor laser device.
Figure 11:
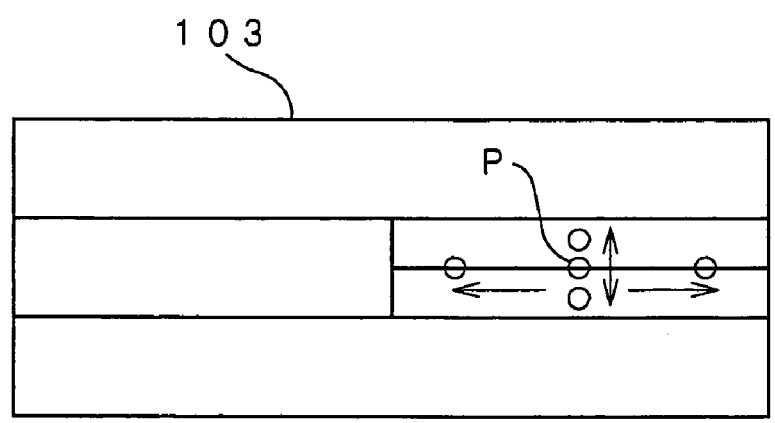
FIG. 11 is a top view showing a light acceptance unit for signal detecting of the conventional semiconductor laser device.

As an another variation of above embodiment, as shown in FIG. 7, two light acceptance units 5a, 5b for signal detecting may be disposed. In this case, as shown in FIG. 8, incident light to the hologram 9a is refracted by the hologram 9a to generate +primary light $Q_1$ and −primary light $Q_2$ which come into the light acceptance units 5a, 5b for signal detecting, respectively. At this time, the light input quantities inputted into both of the light acceptance units 5a, 5b for signal detecting are identical. Signal detecting conducted in this manner enables to obtain a differential signal of light inputted to the light acceptance units 5a, 5b for signal detecting, which can counteract fluctuation of properties due to positional fluctuations in the left-right and up-down directions of the light inputted into the light acceptance units 5a, 5b for signal detecting and can compensate the fluctuation part.

Although the present invention has been fully described by way of the examples with reference to the accompanying drawing, it is to be noted that various changes and modifications will be apparent to those skilled in the art. Therefore, unless such changes and modifications otherwise depart from the spirit and scope of the present invention, they should be construed as being included therein.

What is claimed is:

1. A semiconductor laser device, comprising:
an insulative frame;

a semiconductor laser element disposed inside the insulative frame, the semiconductor laser element emitting laser light in a plane direction;

a reflection mirror disposed inside the insulative frame, the reflection mirror reflecting the laser light in an upper direction;

a light acceptance unit for signal detecting disposed inside the insulative frame, the light acceptance unit detecting signals of incident laser light; and a plurality of leads fixed in end walls opposed to each other in the longitudinal direction of the insulative frame, the plurality of leads extending in a horizontal direction;

wherein the insulative frame is made of liquid crystal polymer, and wherein one end of each of the leads protrudes inside the end walls and openings are formed above and beneath the end of each of the leads which protrudes inside the end walls on upper and lower surfaces of the insulative frame.

2. A semiconductor laser device as in claim 1, wherein thick portions are formed on both side walls extending in a longitudinal direction of the insulative frame.

3. A semiconductor laser device as in claim 1, wherein the reflection mirror is mounted using UV resin.

4. A semiconductor laser device as in claim 1, wherein the light acceptance unit for signal detecting comprises two light acceptance units.

* * * * *